(12) United States Patent
Tomasek et al.

(10) Patent No.: US 11,315,580 B2
(45) Date of Patent: Apr. 26, 2022

(54) AUDIO DECODER SUPPORTING A SET OF DIFFERENT LOSS CONCEALMENT TOOLS

(71) Applicant: Fraunhofer-Gesellschaft zur Förderung der angewandten Forschung e.V., Munich (DE)

(72) Inventors: Adrian Tomasek, Erlangen (DE); Emmanuel Ravelli, Erlangen (DE); Markus Schnell, Erlangen (DE); Alexander Tschekalinskij, Erlangen (DE); Michael Schnabel, Erlangen (DE); Ralph Sperschneider, Erlangen (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/867,834

(22) Filed: May 6, 2020

(65) Prior Publication Data

US 2020/0265846 A1  Aug. 20, 2020

Related U.S. Application Data

(63) Continuation of application No. PCT/EP2018/080198, filed on Nov. 5, 2018.

(30) Foreign Application Priority Data

Nov. 10, 2017  (EP) .................................... 17201142

(51) Int. Cl.
*G10L 19/02* (2013.01)
*G10L 19/005* (2013.01)
(Continued)

(52) U.S. Cl.
CPC ............ *G10L 19/02* (2013.01); *G10L 19/005* (2013.01); *G10L 19/06* (2013.01); *G10L 19/167* (2013.01);
(Continued)

(58) Field of Classification Search
CPC ........ G10L 19/005; G10L 19/02; G10L 25/81
See application file for complete search history.

(56) References Cited

U.S. PATENT DOCUMENTS 4,972,484 A  11/1990 Link et al.
5,012,517 A  4/1991 Chhatwal et al.
(Continued)

FOREIGN PATENT DOCUMENTS

CN  101140759 A  3/2008
CN  102779526 A  11/2012
(Continued)

OTHER PUBLICATIONS

O.E. Groshev, "Office Action for RU Application No. 2020118947", dated Dec. 1, 2020, ROSPATENT, Russia.
(Continued)

*Primary Examiner* — Bryan S Blankenagel
(74) *Attorney, Agent, or Firm* — Novick, Kim & Lee, PLLC; Jae Youn Kim; Jihun Kim

(57) ABSTRACT

An assignment of one of phase set of different loss concealment tools of an audio decoder to a portion of the audio signal to be decoded from a data stream, which portion is affected by loss, that is the selection out of the set of different loss concealment tools, may be made in a manner leading to a more pleasant loss concealment if the assignment/selection is done based on two measures: A first measure which is determined measures a spectral position of a spectral centroid of a spectrum of the audio signal and a second measure which is determined measures a temporal predictability of the audio signal. The assigned or selected loss concealment tool may then be used to recover the portion of the audio signal.

21 Claims, 8 Drawing Sheets

(51) Int. Cl.
　　*G10L 25/81* (2013.01)
　　*G10L 19/06* (2013.01)
　　*G10L 19/16* (2013.01)
　　*H03M 7/30* (2006.01)
　　*H04L 65/60* (2022.01)

(52) U.S. Cl.
　　CPC .......... *G10L 25/81* (2013.01); *H03M 7/3059* (2013.01); *H03M 7/6005* (2013.01); *H04L 65/601* (2013.01)

(56) References Cited

U.S. PATENT DOCUMENTS

| | | | |
|---|---|---|---|
| 5,581,653 | A | 12/1996 | Todd |
| 5,651,091 | A | 7/1997 | Chen et al. |
| 5,781,888 | A | 7/1998 | Herre |
| 5,812,971 | A | 9/1998 | Herre |
| 5,819,209 | A | 10/1998 | Inoue |
| 5,909,663 | A | 6/1999 | Iijima et al. |
| 5,999,899 | A | 12/1999 | Robinson |
| 6,018,706 | A | 1/2000 | Huang et al. |
| 6,148,288 | A | 11/2000 | Park |
| 6,167,093 | A | 12/2000 | Tsutsui et al. |
| 6,507,814 | B1 | 1/2003 | Gao |
| 6,570,991 | B1* | 5/2003 | Scheirer ............... G10H 1/00 381/110 |
| 6,665,638 | B1 | 12/2003 | Kang et al. |
| 6,735,561 | B1 | 5/2004 | Johnston et al. |
| 7,009,533 | B1 | 3/2006 | Wegener |
| 7,353,168 | B2 | 4/2008 | Chen et al. |
| 7,395,209 | B1 | 7/2008 | Dokic et al. |
| 7,539,612 | B2 | 5/2009 | Chen et al. |
| 7,546,240 | B2 | 6/2009 | Chen et al. |
| 8,015,000 | B2 | 9/2011 | Chen et al. |
| 8,095,359 | B2 | 1/2012 | Boehm et al. |
| 8,280,538 | B2 | 10/2012 | Kim et al. |
| 8,473,301 | B2 | 6/2013 | Chen et al. |
| 8,543,389 | B2 | 9/2013 | Ragot et al. |
| 8,554,549 | B2 | 10/2013 | Oshikiri et al. |
| 8,612,240 | B2 | 12/2013 | Fuchs et al. |
| 8,682,681 | B2 | 3/2014 | Fuchs et al. |
| 8,738,385 | B2 | 5/2014 | Chen |
| 8,751,246 | B2 | 6/2014 | Bayer et al. |
| 8,847,795 | B2 | 9/2014 | Faure et al. |
| 8,891,775 | B2 | 11/2014 | Mundt et al. |
| 8,898,068 | B2 | 11/2014 | Fuchs et al. |
| 9,026,451 | B1 | 5/2015 | Kleijn et al. |
| 9,123,350 | B2 | 9/2015 | Zhao et al. |
| 9,489,961 | B2 | 11/2016 | Kovesi et al. |
| 9,595,262 | B2 | 3/2017 | Fuchs et al. |
| 10,726,854 | B2 | 7/2020 | Ghido et al. |
| 2001/0026327 | A1 | 10/2001 | Schreiber et al. |
| 2003/0101050 | A1 | 5/2003 | Cuperman et al. |
| 2005/0010395 | A1 | 1/2005 | Chiu et al. |
| 2005/0015249 | A1 | 1/2005 | Chen et al. |
| 2005/0192799 | A1 | 9/2005 | Kim et al. |
| 2005/0246178 | A1 | 11/2005 | Fejzo |
| 2006/0288851 | A1 | 12/2006 | Esima et al. |
| 2007/0033056 | A1 | 2/2007 | Johnston et al. |
| 2007/0078646 | A1 | 4/2007 | Lei et al. |
| 2007/0118369 | A1 | 5/2007 | Chen |
| 2007/0127729 | A1 | 6/2007 | Breebaart et al. |
| 2007/0129940 | A1 | 6/2007 | Geyersberger et al. |
| 2007/0276656 | A1 | 11/2007 | Solbach et al. |
| 2008/0033718 | A1 | 2/2008 | Zopf et al. |
| 2008/0126086 | A1 | 5/2008 | Kandhadai et al. |
| 2008/0126096 | A1* | 5/2008 | Oh .................. G10L 19/005 704/265 |
| 2009/0076805 | A1 | 3/2009 | Du et al. |
| 2009/0076830 | A1 | 3/2009 | Taleb |
| 2009/0089050 | A1 | 4/2009 | Mo et al. |
| 2009/0138267 | A1 | 5/2009 | Davidson et al. |
| 2009/0254352 | A1* | 10/2009 | Zhao .................. G10L 25/78 704/500 |
| 2010/0010810 | A1 | 1/2010 | Morii |
| 2010/0070270 | A1 | 3/2010 | Gao |
| 2010/0094637 | A1 | 4/2010 | Vinton |
| 2010/0115370 | A1 | 5/2010 | Ramo et al. |
| 2010/0198588 | A1* | 8/2010 | Sudo .................. G10L 21/038 704/205 |
| 2010/0223061 | A1 | 9/2010 | Ojanpera |
| 2010/0312552 | A1 | 12/2010 | Kandhadai et al. |
| 2010/0312553 | A1 | 12/2010 | Fang et al. |
| 2010/0324912 | A1 | 12/2010 | Oh et al. |
| 2011/0015768 | A1 | 1/2011 | Kim et al. |
| 2011/0022924 | A1 | 1/2011 | Malenovsky et al. |
| 2011/0035212 | A1 | 2/2011 | Briand et al. |
| 2011/0060597 | A1 | 3/2011 | Chen et al. |
| 2011/0071839 | A1 | 3/2011 | Budnikov et al. |
| 2011/0095920 | A1 | 4/2011 | Ashley et al. |
| 2011/0096830 | A1 | 4/2011 | Ashley et al. |
| 2011/0116542 | A1 | 5/2011 | Antonini et al. |
| 2011/0125505 | A1 | 5/2011 | Gournay et al. |
| 2011/0145003 | A1 | 6/2011 | Bessette |
| 2011/0196673 | A1 | 8/2011 | Park et al. |
| 2011/0200198 | A1 | 8/2011 | Bayer et al. |
| 2011/0238425 | A1 | 9/2011 | Lecomte et al. |
| 2011/0238426 | A1 | 9/2011 | Borsum et al. |
| 2012/0010879 | A1 | 1/2012 | Kikuiri et al. |
| 2012/0022881 | A1 | 1/2012 | Geiger et al. |
| 2012/0072209 | A1 | 3/2012 | Krishnan et al. |
| 2012/0109659 | A1 | 5/2012 | Chen et al. |
| 2012/0214544 | A1 | 8/2012 | Rodriguez et al. |
| 2012/0245947 | A1 | 9/2012 | Neuendorf et al. |
| 2012/0265540 | A1 | 10/2012 | Fuchs et al. |
| 2012/0265541 | A1 | 10/2012 | Geiger et al. |
| 2013/0030819 | A1 | 1/2013 | Carlsson et al. |
| 2013/0096912 | A1 | 4/2013 | Resch et al. |
| 2013/0226594 | A1 | 8/2013 | Fuchs et al. |
| 2013/0282369 | A1 | 10/2013 | Ryu et al. |
| 2014/0052439 | A1 | 2/2014 | Nanjundaswamy et al. |
| 2014/0067404 | A1 | 3/2014 | Baumgarte |
| 2014/0074486 | A1* | 3/2014 | Disch .................. G10L 19/02 704/500 |
| 2014/0108020 | A1 | 4/2014 | Bai et al. |
| 2014/0142957 | A1 | 5/2014 | Lee et al. |
| 2014/0223029 | A1 | 8/2014 | Bhaskar et al. |
| 2014/0358531 | A1 | 12/2014 | Vos |
| 2015/0010155 | A1 | 1/2015 | Lang et al. |
| 2015/0081312 | A1 | 3/2015 | Fuchs et al. |
| 2015/0142452 | A1 | 5/2015 | Lee et al. |
| 2015/0154969 | A1 | 6/2015 | Craven et al. |
| 2015/0170668 | A1 | 6/2015 | Kovesi et al. |
| 2015/0221311 | A1 | 8/2015 | Jeon et al. |
| 2015/0228287 | A1* | 8/2015 | Bruhn ............... G10L 19/025 704/500 |
| 2015/0255079 | A1* | 9/2015 | Huang ............... G10L 19/005 704/500 |
| 2015/0302859 | A1 | 10/2015 | Aguilar et al. |
| 2015/0325246 | A1 | 11/2015 | Chen et al. |
| 2015/0371647 | A1 | 12/2015 | Faure et al. |
| 2016/0019898 | A1 | 1/2016 | Schreiner et al. |
| 2016/0027450 | A1 | 1/2016 | Gao |
| 2016/0078878 | A1 | 3/2016 | Ravelli et al. |
| 2016/0111094 | A1 | 4/2016 | Dietz et al. |
| 2016/0225384 | A1 | 8/2016 | Kjörling et al. |
| 2016/0285718 | A1* | 9/2016 | Bruhn ............... H04L 43/0829 |
| 2016/0293174 | A1 | 10/2016 | Atti et al. |
| 2016/0293175 | A1 | 10/2016 | Atti et al. |
| 2016/0307576 | A1* | 10/2016 | Fuchs ............... G10L 19/0017 |
| 2016/0365097 | A1 | 12/2016 | Guan et al. |
| 2016/0372125 | A1 | 12/2016 | Atti et al. |
| 2016/0372126 | A1 | 12/2016 | Atti et al. |
| 2016/0379655 | A1 | 12/2016 | Truman et al. |
| 2017/0011747 | A1 | 1/2017 | Faure et al. |
| 2017/0053658 | A1 | 2/2017 | Atti et al. |
| 2017/0078794 | A1 | 3/2017 | Bongiovi et al. |
| 2017/0103769 | A1 | 4/2017 | Laaksonen et al. |
| 2017/0110135 | A1 | 4/2017 | Disch et al. |
| 2017/0133029 | A1 | 5/2017 | Markovic et al. |
| 2017/0140769 | A1 | 5/2017 | Ravelli et al. |
| 2017/0154631 | A1 | 6/2017 | Bayer et al. |
| 2017/0154635 | A1 | 6/2017 | Doehla et al. |
| 2017/0221495 | A1 | 8/2017 | Sung et al. |

(56) References Cited

U.S. PATENT DOCUMENTS

| | | | |
|---|---|---|---|
| 2017/0236521 A1 | 8/2017 | Atti et al. | |
| 2017/0256266 A1 | 9/2017 | Sung et al. | |
| 2017/0294196 A1 | 10/2017 | Bradley et al. | |
| 2017/0303114 A1 | 10/2017 | Johansson et al. | |
| 2019/0027156 A1 | 1/2019 | Sung et al. | |

FOREIGN PATENT DOCUMENTS

| | | |
|---|---|---|
| CN | 107103908 A | 8/2017 |
| EP | 0716787 A1 | 6/1996 |
| EP | 0732687 B2 | 9/1996 |
| EP | 1791115 A2 | 5/2007 |
| EP | 2676266 B1 | 12/2013 |
| EP | 2980796 A1 | 2/2016 |
| EP | 2980799 A1 | 2/2016 |
| EP | 3111624 A1 | 1/2017 |
| FR | 2944664 A1 | 10/2010 |
| JP | H05-281996 A | 10/1993 |
| JP | H07-28499 A | 1/1995 |
| JP | H0811644 A | 1/1996 |
| JP | H9-204197 A | 8/1997 |
| JP | H10-51313 A | 2/1998 |
| JP | H1091194 A | 4/1998 |
| JP | H11-330977 A | 11/1999 |
| JP | 2004-138756 A | 5/2004 |
| JP | 2006-527864 A | 12/2006 |
| JP | 2007-525718 A | 9/2007 |
| JP | 2009-003387 A | 1/2009 |
| JP | 2009-008836 A | 1/2009 |
| JP | 2009-538460 A | 11/2009 |
| JP | 2010-500631 A | 1/2010 |
| JP | 2010-501955 A | 1/2010 |
| JP | 2012-533094 A | 12/2012 |
| JP | 2016-523380 A | 8/2016 |
| JP | 2016-200750 A | 12/2016 |
| JP | 2017-522604 A | 8/2017 |
| JP | 2017-528752 A | 9/2017 |
| KR | 100261253 B1 | 7/2000 |
| KR | 20030031936 A | 4/2003 |
| KR | 10-2010-0136890 A | 12/2010 |
| KR | 20130019004 A | 2/2013 |
| KR | 20170000933 A | 1/2017 |
| RU | 2337414 C2 | 10/2008 |
| RU | 2376657 C2 | 12/2009 |
| RU | 2413312 C2 | 2/2011 |
| RU | 2419891 C2 | 5/2011 |
| RU | 2439718 C1 | 1/2012 |
| RU | 2483365 C2 | 5/2013 |
| RU | 2520402 C2 | 6/2014 |
| RU | 2568381 C2 | 11/2015 |
| RU | 2596594 C2 | 9/2016 |
| RU | 2596596 C2 | 9/2016 |
| RU | 2015136540 A | 3/2017 |
| RU | 2628162 C2 | 8/2017 |
| RU | 2016105619 A | 8/2017 |
| TW | 200809770 A | 2/2008 |
| TW | 201005730 A | 2/2010 |
| TW | 201126510 A | 8/2011 |
| TW | 201131550 A | 9/2011 |
| TW | 201207839 A | 2/2012 |
| TW | 201243832 A | 11/2012 |
| TW | 201612896 A | 4/2016 |
| TW | 201618080 A | 5/2016 |
| TW | 201618086 A | 5/2016 |
| TW | 201642246 A | 12/2016 |
| TW | 201642247 A | 12/2016 |
| TW | 201705126 A | 2/2017 |
| TW | 201711021 A | 3/2017 |
| TW | 201713061 A | 4/2017 |
| TW | 201724085 A | 7/2017 |
| TW | 201732779 A | 9/2017 |
| WO | 9916050 A1 | 4/1999 |
| WO | 2004/072951 A1 | 8/2004 |
| WO | 2005/086138 A1 | 9/2005 |
| WO | 2005/086139 A1 | 9/2005 |
| WO | 2007/073604 A1 | 7/2007 |
| WO | 2007/138511 A1 | 12/2007 |
| WO | 2008/025918 A1 | 3/2008 |
| WO | 2008/046505 A1 | 4/2008 |
| WO | 2009/066869 A1 | 5/2009 |
| WO | 2011/048118 A1 | 4/2011 |
| WO | 2011/086066 A1 | 7/2011 |
| WO | 2011/086067 A1 | 7/2011 |
| WO | 2012/000882 A | 1/2012 |
| WO | 2012/000882 A1 | 1/2012 |
| WO | 2012/126893 A | 9/2012 |
| WO | 2014/165668 A | 10/2014 |
| WO | 2014/202535 A | 12/2014 |
| WO | 2014/202535 A1 | 12/2014 |
| WO | 2015/063045 A1 | 5/2015 |
| WO | 2015/063227 A1 | 5/2015 |
| WO | 2015/071173 A1 | 5/2015 |
| WO | 2015/174911 A1 | 11/2015 |
| WO | 2016/016121 A1 | 2/2016 |
| WO | 2016/142002 A1 | 9/2016 |
| WO | 2016/142337 A1 | 9/2016 |

OTHER PUBLICATIONS

O.I. Starukhina, "Office Action for RU Application No. 2020118968", dated Dec. 23, 2020, ROSPATENT, Russia.

ETSI TS 126 445 V13.2.0 (Aug. 2016), Universal Mobile Telecommunications System (UMTS); LTE; Codec for Enhanced Voice Services (EVS); Detailed algorithmic description (3GPP TS 26.445 version 13.2.0 Release 13) [Online]. Available: http://www.3gpp.org/ftp/Specs/archive/26_series/26.445/26445-d00.zip.

Geiger, "Audio Coding based on integer transform", Ilmenau: https://www.db-thueringen.de/receive/dbt_mods_00010054, 2004.

Henrique S Malvar, "Biorthogonal and Nonuniform Lapped Transforms for Transform Coding with Reduced Blocking and Ringing Artifacts", IEEE Transactions on Signal Processing, IEEE Service Center, New York, NY, US, (199804), vol. 46, No. 4, ISSN 1053-587X, XP011058114.

Anonymous, "ISO/IEC 14496-3:2005/FDAM 9, AAC-ELD", 82. MPEG Meeting;Oct. 22, 2007-Oct. 26, 2007; Shenzhen; (Motion Picture Expert Group or ISO/IEC JTC1/SC29/WG11),, (Feb. 21, 2008), No. N9499, XP030015994.

Virette, "Low Delay Transform for High Quality Low Delay Audio Coding", Université de Rennes 1, (Dec. 10, 2012), pp. 1-195, URL: https://hal.inria.fr/tel-01205574/document, (Mar. 30, 2016), XP055261425.

ISO/IEC 14496-3:2001; Information technology—Coding of audiovisual objects—Part 3: Audio.

3GPP TS 26.403 v14.0.0 (Mar. 2017); General audio codec audio processing functions; Enhanced acPlus general audio codec; Encoder specification; Advanced Audio Coding (AAC) part; (Release 14).

ISO/IEC 23003-3; Information technology—MPEG audio technologies—Part 3: Unified speech and audio coding, 2011.

3GPP TS 26.445 V14.1.0 (Jun. 2017), 3rd Generation Partnership Project; Technical Specification Group Services and System Aspects; Codec for Enhanced Voice Services (EVS); Detailed Algorithmic Description (Release 14), http://www.3gpp.org/ftp//Specs/archive/26_series/26.445/26445-e10.zip, Section 5.1.6 "Bandwidth detection".

Eksler Vaclav et al., "Audio bandwidth detection in the EVS codec", 2015 IEEE Global Conference on Signal and Information Processing (Globalsip), IEEE, (Dec. 14, 2015), doi:10.1109/GLOBALSIP.2015.7418243, pp. 488-492, XP032871707.

Oger M et al, "Transform Audio Coding with Arithmetic-Coded Scalar Quantization and Model-Based Bit Allocation", International Conference on Acoustics, Speech, and Signalprocessing, IEEE, XX,Apr. 15, 2007 (Apr. 15, 2007), p. IV-545, XP002464925.

Asad et al., "An enhanced least significant bit modification technique for audio steganography", International Conference on Computer Networks and Information Technology, Jul. 11-13, 2011.

Makandar et al, "Least Significant Bit Coding Analysis for Audio Steganography", Journal of Future Generation Computing, vol. 2, No. 3, Mar. 2018.

(56) References Cited

OTHER PUBLICATIONS

ISO/IEC 23008-3:2015; Information technology—High efficiency coding and media delivery in heterogeneous environments—Part 3: 3D audio.
Itu-T G.718 (Jun. 2008): Series G: Transmission Systems and Media, Digital Systems and Networks, Digital terminal equipments—Coding of voice and audio signals, Frame error robust narrow-band and wideband embedded variable bit-rate coding of speech and audio from 8-32 kbit/s.
3GPP TS 26.447 V14.1.0 (Jun. 2017), Technical Specification, 3rd Generation Partnership Project; Technical Specification Group Services and System Aspects; Codec for Enhanced Voice Services (EVS); Error Concealment of Lost Packets (Release 14).
DVB Organization, "ISO-IEC_23008-3_A3_(E)_(H 3DA FDAM3). docx", DVB, Digital Video Broadcasting, C/O EBU—17A Ancienne Route—CH-1218 Grand Saconnex, Geneva—Switzerland, (Jun. 13, 2016), XP017851888.
Hill et al., "Exponential stability of time-varying linear systems," IMA J Numer Anal, pp. 865-885, 2011.
3GPP Ts 26.090 V14.0.0 (Mar. 2017), 3rd Generation Partnership Project; Technical Specification Group Services and System Aspects; Mandatory Speech Codec speech processing functions; Adaptive Multi-Rate (AMR) speech codec; Transcoding functions (Release 14).
3GPP TS 26.190 V14.0.0 (Mar. 2017), Technical Specification, 3rd Generation Partnership Project; Technical Specification Group Services and System Aspects; Speech codec speech processing functions; Adaptive Multi-Rate—Wideband (AMR-WB) speech codec; Transcoding functions (Release 14).
3GPP TS 26.290 V14.0.0 (Mar. 2017), Technical Specification, 3rd Generation Partnership Project; Technical Specification Group Services and System Aspects; Audio codec processing functions; Extended Adaptive Multi-Rate—Wideband (AMR-WB+) codec; Transcoding functions (Release 14).
Edler et al., "Perceptual Audio Coding Using a Time-Varying Linear Pre-and Post-Filter," in AES 109th Convention, Los Angeles, 2000.
Cray et al., "Digital lattice and ladder filter synthesis," IEEE Transactions on Audio and Electroacoustics, vol. vol. 21, No. No. 6, pp. 491-500, 1973.
Lamoureux et al., "Stability of time variant filters," CREWES Research Report—vol. 19, 2007.
Herre et al., "Enhancing the performance of perceptual audio coders by using temporal noise shaping (TNS)." Audio Engineering Society Convention 101. Audio Engineering Society, 1996.
Herre et al., "Continuously signal-adaptive filterbank for high-quality perceptual audio coding." Applications of Signal Processing to Audio and Acoustics, 1997. 1997 IEEE ASSP Workshop on. IEEE, 1997.
Herre, "Temporal noise shaping, quantization and coding methods in perceptual audio coding: A tutorial ntroduction." Audio Engineering Society Conference: 17th International Conference: High-Quality Audio Coding. Audio Engineering Society, 1999.
Fuchs Guillaume et al, "Low delay LPC and MDCT-based audio coding in the EVS codec", 2015 IEEE International Conference on Acoustics, Speech and Signal Processing (ICASSP), IEEE, (Apr. 19, 2015), doi: 10.1109/ICASSP.2015.7179068, pp. 5723-5727, XP033187858.
Niamut et al, "RD Optimal Temporal Noise Shaping for Transform Audio Coding", Acoustics, Speech and Signal Processing, 2006. ICASSP 2006 Proceedings. 2006 IEEE International Conference on Toulouse, France May 14-19, 2006, Piscataway, NJ, USA,IEEE, Piscataway, NJ, USA, (Jan. 1, 2006), doi:10.1109/ICASSP.2006. 1661244, ISBN 978-1-4244-0469-8, pp. V-V, XP031015996.
Itu-T G.711 (09/99): Series G: Transmission Systems and Media, Digital Systems and Networks, Digital transmission systems—Terminal equipments—Coding of analogue signals by pulse code modulation, Pulse code modulation (PCM) of voice frequencies, Appendix I: A high quality low-complexity algorithm for packet loss concealment with G.711.
Cheveigne et al.,"YIN, a fundamental frequency estimator for speech and music." The Journal of the Acoustical Society of America 111.4 (2002): 1917-1930.
Ojala P et al, "A novel pitch-lag search method using adaptive weighting and median filtering", Speech Coding Proceedings, 1999 IEEE Workshop on Porvoo, Finland Jun. 20-23, 1999, Piscataway, NJ, USA, IEEE, US, (Jun. 20, 1999), doi:10.1109/SCFT.1999. 781502, ISBN 978-0-7803-5651-1, pp. 114-116, XP010345546.
"5 Functional description of the encoder", Dec. 10, 2014 (Dec. 10, 2014), 3GPP Standard; 26445-C10_1_S05_S0501, 3rd Generation Partnership Project (3GPP)?, Mobile Competence Centre ; 650, Route Des Lucioles ; F-06921 Sophia-Antipolis Cedex; France Retrieved from the lnternet:URL: http://www.3gpp.org/ftp/Specs/ 2014-12/Rel-12/26_series/ XP050907035.
Sujoy Sarkar, "Examination Report for IN Application No. 202037018091", dated Jun. 1, 2021, Intellectual Property India, India.
"Decision on Grant Patent for Invention for RU Application No. 2020118949", Nov. 11, 2020, ROSPATENT, Russia.
P.A. Volkov, "Office Action for RU Application No. 2020120251", dated Oct. 28, 2020, ROSPATENT, Russia.
P.A. Volkov, "Office Action for RU Application No. 2020120256", dated Oct. 28, 2020, ROSPATENT, Russia.
D.V.Travnikov, "Decision on Grant for RU Application No. 2020118969", Nov. 2, 2020, ROSPATENT, Russia.
Santosh Mehtry, "Office Action for IN Application No. 202037019203", dated Mar. 19, 2021, Intellectual Property India, India.
Takeshi Yamashita, "Office Action for JP Application 2020-524877", dated Jun. 24, 2021, JPO, Japan.
Tomonori Kikuchi, "Office Action for JP Application No. 2020-524874", dated Jun. 2, 2021, JPO Japan.
Khalid Sayood, "Introduction to Data Compression", Elsevier Science & Technology, 2005, Section 16.4, Figure 16. 13, p. 526.
Patterson et al., "Computer Organization and Design", The hardware/ software Interface, Revised Fourth Edition, Elsevier, 2012.
John Tan, "Office Action for SG Application 11202004173P", dated Jul. 23, 2021, IPOS, Singapore.
Tetsuyuki Okumachi, "Office Action for JP Application 2020-118837", dated Jul. 16, 2021, JPO, Japan.
Tetsuyuki Okumachi, "Office Action for JP Application 2020-118838", dated Jul. 16, 2021, JPO, Japan.
Guojun Lu et al., "A Technique towards Automatic Audio Classification and Retrieval, Forth International Conference on Signal Processing", 1998, IEEE, Oct. 12, 1998, pp. 1142 to 1145.
Hiroshi Ono, "Office Action for JP Application No. 2020-526135", dated May 21, 2021, JPO Japan.
Hiroshi Ono, "Office Action for JP Application No. 2020-526081", dated Jun. 22, 2021, JPO, Japan.
Hiroshi Ono, "Office Action for JP Application No. 2020-526084", dated Jun. 23, 2021, JPO, Japan.
Miao Xiaohong, "Examination Report for SG Application No. 11202004228V", dated Sep. 2, 2021, IPOS, Singapore.
Miao Xiaohong, "Search Report for SG Application No. 11202004228V", dated Sep. 3, 2021, IPOS, Singapore.
Nam Sook Lee, "Office Action for KR Application No. 10-2020-7015512", dated Sep. 9, 2021, KIPO, Republic of Korea.
Dietz, Martin et al., "Overview of the EVS codec architecture." 2015 IEEE International Conference on Acoustics, Signal Processing (ICASSP), IEEE, 2015.
Kazunori Mochimura, "Decision to Grant a Patent for JP application No. 2020-524579", dated Nov. 25, 2021, JPO, Japan.
International Telecommunication Union, "G. 729-based embedded variable bit-rate coder: An 8-32 kbit/s scalable wideband coder bitstream interoperable with G.729". ITU-T Recommendation G.729. 1., May 2006.
3GGP TS 26.445, "Universal Mobile TElecommunications System (UMTS); LTE; Codec for Enhanced Voice Services (EVS); Detailed algorithmic description (3GPP TS 26.445 version 13.4.1 Release 13)", ETSI TS 126 445 V13.4.1., Apr. 2017.
Nam Sook Lee, "Office Action for KR Application No. 10-2020-7016100", dated Jan. 13, 2022, KIPO, Republic of Korea.
Nam Sook Lee, "Office Action for KR Application No. 10-2020-7016224", dated Jan. 13, 2022, KIPO, Republic of Korea.

(56) References Cited

OTHER PUBLICATIONS

Nam Sook Lee, "Office Action for KR Application No. 10-2020-7015835", dated Jan. 13, 2022, KIPO, Republic of Korea.
Nam Sook Lee, "Office Action for KR Application No. 10-2020-7016424", dated Feb. 9, 2022, KIPO, Korea.
Nam Sook Lee, "Office Action for KR Application No. 10-2020-7016503", dated Feb. 9, 2022, KIPO, Korea.

* cited by examiner

AUDIO DECODER SUPPORTING A SET OF DIFFERENT LOSS CONCEALMENT TOOLS

CROSS-REFERENCES TO RELATED APPLICATIONS

This application is a continuation of copending International Application No. PCT/EP2018/080198, filed Nov. 5, 2018, which is incorporated herein by reference in its entirety, and additionally claims priority from European Application No. EP 17 201 142.1, filed Nov. 10, 2017, which is incorporated herein by reference in its entirety.

The present application is concerned with an audio decoder supporting a set of different loss concealment tools.

BACKGROUND OF THE INVENTION

Packet loss concealment (PLC) is used in audio codecs to conceal lost or corrupted packets during the transmission from the encoder to the decoder. PLC is performed at the decoder side and works by extrapolating the decoded signal either in the transform-domain or in the time-domain. Ideally, the concealed signal should be artifact-free and should have the same spectral characteristics as the missing signal.

Error robust audio codecs, as described in [2] and [4], have generally multiple concealment methods for the various signal types like speech as an example for a monophonic signal, music as an example for polyphonic signal or noise signal. The selection is based on a set of signal features, which are either transmitted and decoded from the bit stream or estimated in the decoder.

Pitch-based PLC techniques generally produce good results for speech and monophonic signals. These approaches assume that the signal is locally stationary and recover the lost signal by synthesizing a periodic signal using an extrapolated pitch period. These techniques are widely used in CELP-based speech coding such as in ITU-T G.718 [2]. They can also be used for PCM coding such as in ITU-T G.711 [3] and more recently they were applied to DECT-based audio coding, the best example being TCX time domain concealment, TCX TD-PLC, in the 3GPP EVS standard [4].

The pitch-lag is the main parameter used in pitch-based PLC. This parameter can be estimated at the encoder-side and encoded into the bit stream. In this case, the pitch-lag of the last good frame is used to conceal the current lost frame such as in [2] and [4]. If there is no pitch-lag in the bitstream, it can be estimated at the decoder-side by running a pitch detection algorithm on the decoded signal such as in [3].

For non-periodic, non-tonal, noise-like signals, a low complexity technique called frame repetition with sign scrambling has been found to be effective. It is based on repeating the last frame and multiplying the spectral coefficients with a randomly generated sign to conceal the lost frame. One example of MDCT frame repetition with sign scrambling can be found in the 3GPP EVS standard [4].

For tonal polyphonic signals or complex music signals a method is used which is based on predicting the phase of the spectral coefficients of any detected tonal component. This method shows a consistent improvement for stationary tonal signals. A tonal component consists of a peak that also existed in the previous received frame(s). The phase of the spectral coefficients belonging to the tonal components is determined from the power spectrum of the last received frame(s). One example of tonal MDCT concealment can be found in the 3GPP EVS standard [4].

Summarizing the above, different PLC methods are known but they are specific for certain situations, i.e., for certain audio characteristics. That is, an audio coder supporting several of these PLC methods should have a mechanism to choose the most suitable PLC method at the time of encountering frame or packet loss. The most suitable PLC method is the one leading to the least noticeable substitute for the lost signal.

SUMMARY

According to an embodiment, an audio decoder for decoding an audio signal from a data stream may have a set of different loss concealment tools and configured to: determine a first measure measuring a spectral position of a spectral centroid of a spectrum of the audio signal, determine a second measure measuring a temporal predictability of the audio signal, assign one of the set of different loss concealment tools to a portion of the audio signal affected by loss based on the first and second measures, and recover the portion of the audio signal using the one loss concealment tool assigned to the portion.

According to another embodiment, a method for performing loss concealment in audio decoding an audio signal from a data stream may be configured to: determine a first measure measuring a spectral position of a spectral centroid of a spectrum of the audio signal, determine a second measure measuring a temporal predictability of the audio signal, assign one of a set of different loss concealment tools to a portion of the audio signal affected by loss based on the first and second measures, and recover the portion of the audio signal using the one loss concealment tool assigned to the portion.

Another embodiment may have a non-transitory digital storage medium having a computer program stored thereon to perform the method for performing loss concealment in audio decoding an audio signal from a data stream, wherein the method may be configured to: determine a first measure measuring a spectral position of a spectral centroid of a spectrum of the audio signal, determine a second measure measuring a temporal predictability of the audio signal, assign one of a set of different loss concealment tools to a portion of the audio signal affected by loss based on the first and second measures, and recover the portion of the audio signal using the one loss concealment tool assigned to the portion, when said computer program is run by a computer.

The idea of the present invention is based on the finding that an assignment of one of phase set of different loss concealment tools of an audio decoder to a portion of the audio signal to be decoded from a data stream, which portion is affected by loss, that is the selection out of the set of different loss concealment tools, may be made in a manner leading to a more pleasant loss concealment if the assignment/selection is done based on two measures: A first measure which is determined measures a spectral position of a spectral centroid of a spectrum of the audio signal and a second measure which is determined measures a temporal predictability of the audio signal. The assigned or selected loss concealment tool may then be used to recover the portion of the audio signal.

For instance, based on the aforementioned first and second measures, one of first and second loss concealment tools may be assigned to the lost portion with a first being configured to recover the audio signal by audio signal synthesis using a periodic signal of a periodicity which depends on a pitch value derived from the data stream, and the second loss concealment tool may be configured to recover the audio signal by detecting tonal spectral components of the audio signal, performing phase detection at the tonal spectral components and audio signal synthesis by combining the signals of periodicities which depend on the tonal spectral components at adjustment of a mutual phase shift between the signals depending on the phase detection. In other words, based on the first and second measures, one of a tonal frequency domain PLC tool and a tonal time domain PLC tool may be assigned to the lost portion.

In accordance with an embodiment, the assignment/selection for a lost portion is performed in stages: A third measure measuring a tonality of the spectrum of the audio signal is determined and one of a first and second subsets of one or more loss concealment tools out of the set of different loss concealment tools is assigned to the lost portion, and merely if the first subset of one or more loss concealment tools is assigned to the lost portion, the assignment of the one PLC tool for the lost portion is performed based on the first and second measures out of this first subset. Otherwise, the assignment/selection is performed out of the second subset.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
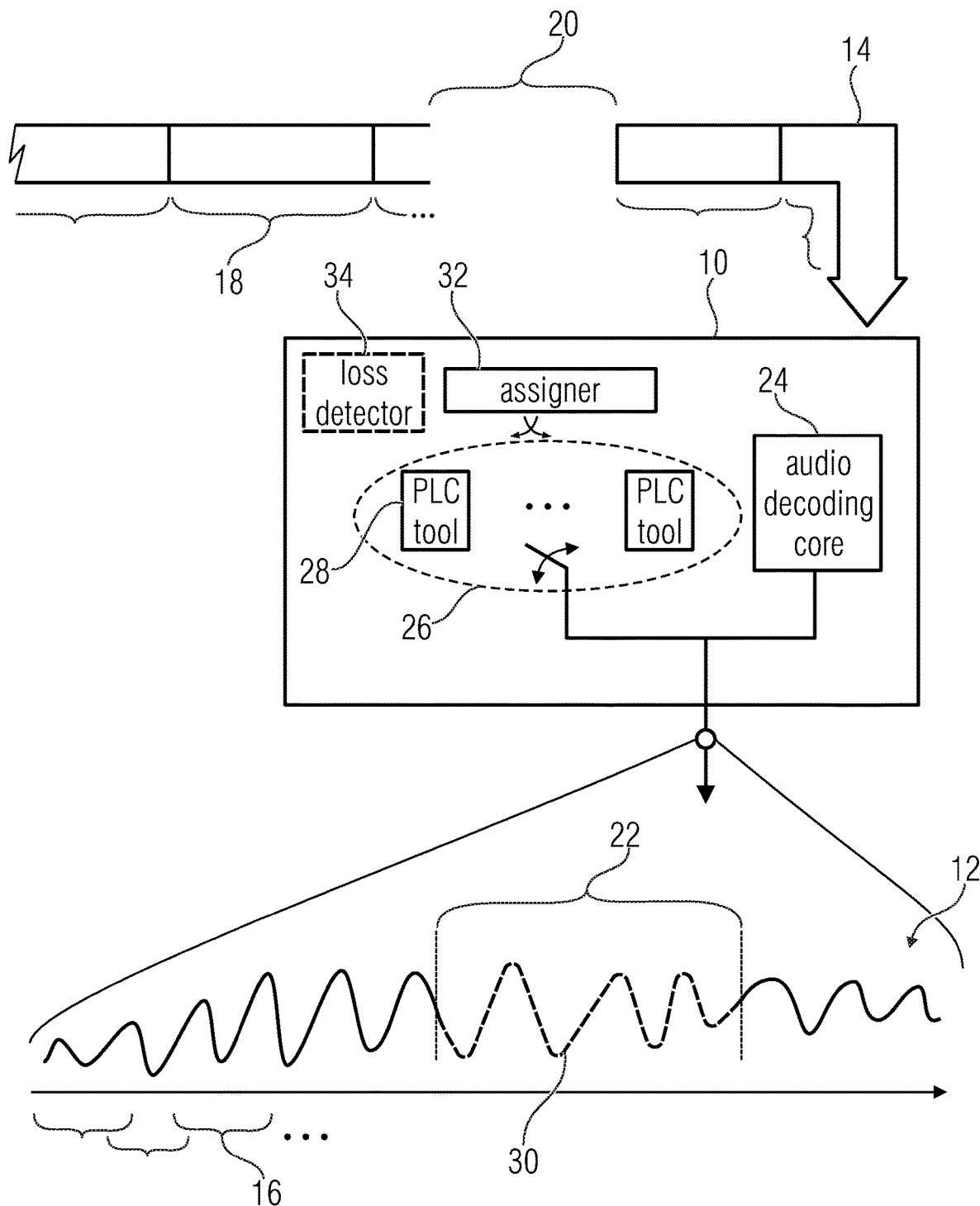
FIG. 1 shows in a schematic manner a block diagram of an audio decoder in accordance with an embodiment of the present application.

FIG. 1 shows an audio decoder in accordance with an embodiment of the present application. As shown therein, the audio decoder 10 is configured to decode an audio signal 12 from a data stream 14. The audio signal 12 may be encoded into data stream 14 in accordance with any suitable audio codec such as a time-domain based audio codec or a frequency-domain audio codec. The audio signal 12 may be coded into data stream 14 in units of temporal portions 16 of frames 18, respectively. To be more precise, the audio signal 12 may be temporally sub-divided into overlapping or non-overlapping temporal portions or intervals 16, each of which corresponds to a certain one of frames 18 which data stream 14 is sub-divided into. Each frame 18 encodes a corresponding temporal portion 16. For instance, a frame 18 may contain information on linear prediction coefficients describing a spectral envelope of the audio signal within the corresponding portion 16. Additionally, frame 18 may have encoded thereinto spectral coefficients describing a spectrum of the audio signal 12 within portion 16 which is to be shaped, for instance, by audio decoder 10 according to the linear prediction coefficients contained in that frame. An overlap add process might also be applied by the audio decoder 10 in reconstructing the audio signal 12 from the data stream 14. Naturally, the possibilities would also apply with the examples presented herein merely serving for ease of understanding.

The data stream 14 may be received by the audio decoder 10 in a packetized form, i.e., in units of packets. The sub-division of data stream 14 into frame 18 itself represents a kind of packetization, i.e., the frames 18 represent packets. Additionally, data stream 14 may be packed into packets of a transport stream or media file format, but this circumstance is not inspected in further detail here. Rather, it should suffice to state that the reception of the data stream 14 by audio decoder 10 is liable to data or signal loss, called packet loss in the following. That is, some continuous portion 20 of the data stream 14 might have got lost during transmission, thus not received by audio decoder 10, so that the corresponding portion is missing and not available for the audio decoder 10. As a consequence, audio decoder 10 misses information in the data stream 14 so as to reconstruct a portion 22 corresponding to portion 20. In other words, the audio decoder 10 is not able to reconstruct portion 22 from data stream 14 in accordance with a normal audio decoding process implemented, for instance, in an audio decoding core 24 of the audio decoder, as portion 20 of data stream 14 is missing. Rather, in order to deal with such missing portions 20, audio decoder 10 comprises a set 26 of PLC tools 28 so as to recover or synthesize the audio signal 12 within portion 22 by a substitute signal 30. The PLC tools 28 comprised by set 26 differs in their suitability for different audio signal characteristics. That is, the degree of annoyance when using a certain PLC tool for the recovery of a signal substitute 30 within a certain portion 22 of the audio signal 12 depends on the audio signal characteristic at that portion 22 and PLC tools 28 within set 26 show mutually different degrees of annoyance for a certain set of audio signal characteristics. Accordingly, audio decoder 10 comprises an assigner 32 which assigns one of the set 26 of packet loss concealment tools 28 to portion 22 of the audio signal 12 which is affected by a packet loss such as the lost portion 20 of data stream 14. The assigner 32 tries to assign the best PLC tool 28 to portion 22, namely the one which leads to the lowest annoyance.

Once the assigner 32 has assigned a certain PLC tool 28 to a lost portion 22 of the audio signal 12, the audio decoder 10 recovers this portion 22 of the audio signal using the assigned PLC tool 28, thereby substituting the audio signal 12 within this portion 22, as it would have been reconstructed from the audio data stream 14 if the corresponding data stream portion 22 would not have got lost, by a substitute signal 30 obtained using the PLC tool 28 assigned for portion 22 by assigner 32.

As already indicated above, the assignment of a particular PLC tool 28 to a certain lost portion 22 should be made signal dependent in order to render the lost concealment as least annoying as possible. Signal dependency, however, is restricted to portions of data stream 14 preceding the lost data stream portion 20 and, in accordance with the embodiment described herein, the assigner 32 acts as follows.

Figure 2:
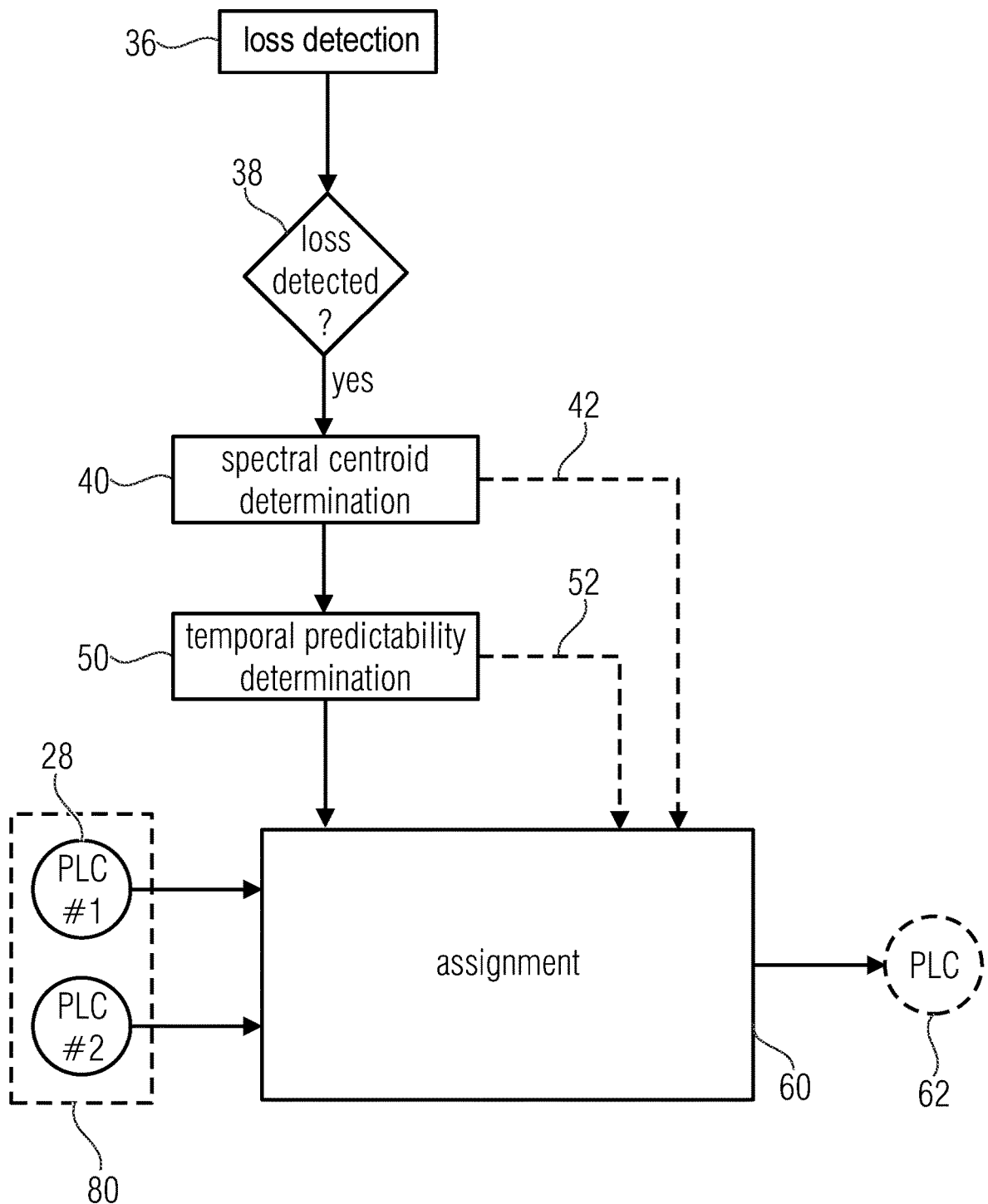
FIG. 2 shows a flow diagram of a mode of operation of the assigner 32 of the audio decoder of FIG. 1 in accordance with an embodiment.
Figure 3:
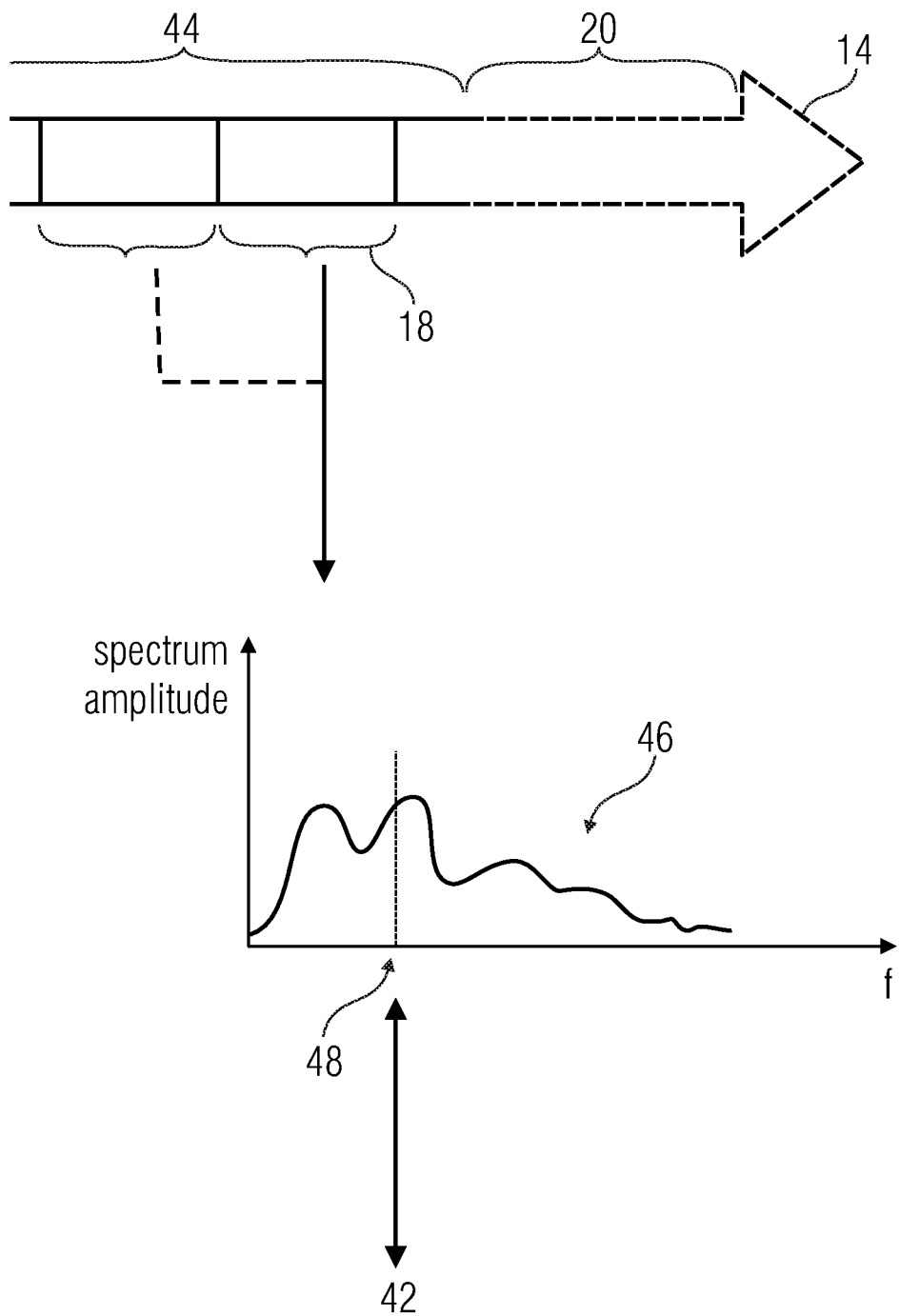
FIG. 3 shows a schematic diagram illustrating a spectral centroid detection for determining the first measure for PLC assignment in FIG. 2 in accordance with an embodiment.

In order to explain this in more detail, reference is made to FIG. 2. FIG. 2 shows that the whole assignment process for a certain missing portion 22 might possibly be triggered by a loss detector 34 possibly present in audio decoder 10. In particular, if loss detection 36 performed by loss detector 34 reveals that some portion 20 of data stream 14 is missing or lost, as checked at 38, the following assignment process is triggered. A determination 40 is performed in order to determine a first measure 42 which measures a spectral position of a spectral centroid of a spectrum of the audio signal. That is, assigner 32 determines a spectral position of a center of mass of a spectrum of the audio signal, see FIG. 3. The audio decoder retrieves from a portion 44 preceding the lost portion 20 of data stream 14, preceding in data stream order, a spectrum 46 of the audio signal. As described above with respect to FIG. 1, it might be that data stream 14 has audio signal 12 encoded thereinto in spectral domain anyway so that no spectral decomposition may be used for assigner 32 to obtain spectrum 46. For instance, spectral coefficients of a most recently received frame 18 or more than one most recently retrieved frame 18 of data stream 14, prior to the lost portion 20, is used to obtain spectrum 46. If more than one frame 18 is used, it could be that spectrum 46 used by assigner 32 is obtained by averaging. In order to perform the determination 40, the center of mass of this spectrum 46 is determined, i.e., a measure 42 measuring a spectral position 48 of spectrum 46. Later on, a specific example is presented.

Figure 4:
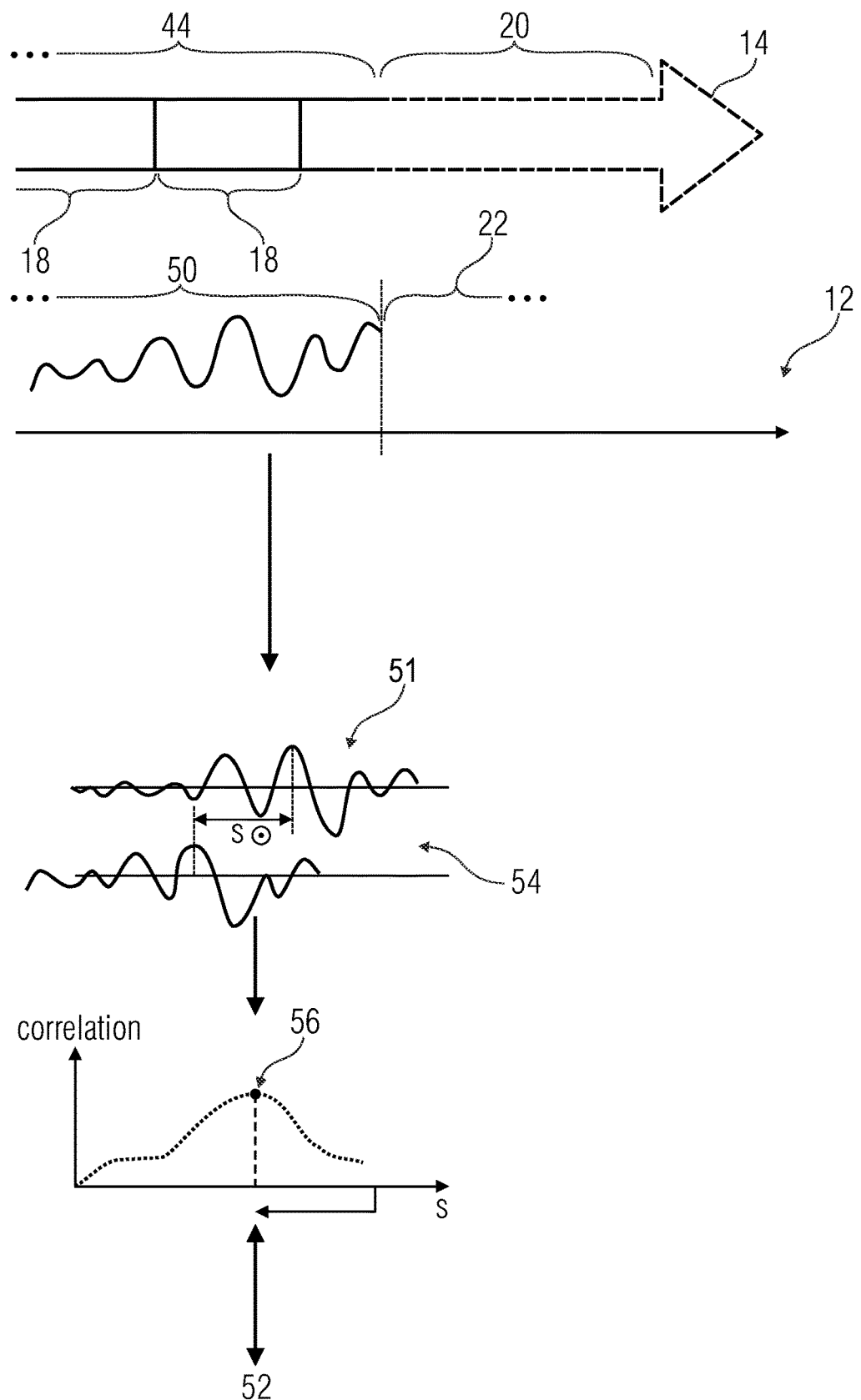
FIG. 4 shows a schematic diagram illustrating the temporal predictability detection for determining the second measure for PLC assignment of FIG. 2 in accordance with an embodiment.

Further, the assignment process triggered by loss detection comprises a determination 50 of a temporal predictability of the audio signal so as to obtain a measure 52 of this temporal predictability, see FIG. 4 for details. As shown therein, in accordance with an embodiment, the temporal predictability detection 50 may rely on the decoded signal or the audio signal 12 as derived from the data stream 14 up to the signal portion 22 which is missing owing to the loss of portion 20 of data stream 14. In other words, the temporal predictability detection 50 may be based on the audio signal 12 within portion 51 which immediately precedes lost portion 22, the loss of which is to be concealed, and which is decoded from portion 44 of data stream 14. The temporal predictability detection 50 may be done in a manner so that measure 52 is a measure for a self-similarity or autocorrelation of the signal portion 51 as illustrated at 54 in FIG. 4. The mutual shift s for which the self-similarity of signal 51 is measured by measure 52 may be determined by assigner 32 in different manners. For instance, assigner 32 may inspect a corresponding pitch parameter conveyed in one or more of the frames 18 within portion 44 preceding lost portion 20 of data stream 14. That is, the mutual shift s at which the self-similarity may be measured may correspond to a pitch period with a pitch being determined based on a parameter in data stream 14, namely portion 44. The self-similarity or correlation 56 at that pitch period shift may be used as the second measure 52.

It is obvious that the order of performing determination 40 and 50, respectively, may be switched or that both detections may be performed concurrently. Based on measures 42 and 52, an assignment 60 is performed. This assignment 60 selects one of two PLC tools 28 for concealment of loss of portion 22. This PLC tool, i.e., the assigned one 62, is then used for the concealment of the loss of portion 22.

As a brief note, it should be noted that the number of PLC tools 28, between which the selection by assignment 60 is performed, may be greater than two.

In accordance with an embodiment further outlined below, however, the PLC tool PLC 1 of FIG. 2 may be described as 1 using which the substitute signal 30, i.e., the audio signal estimate within portion 22, is obtained or recovered using tonal time domain packet loss concealment. In other words, PLC 1 may be a packet loss concealment dedicated for audio signal recovery of monophonic portions. PLC 1 may recover an audio signal within a missing portion 22 of an audio signal 12 using a periodic signal of a periodicity which depends on a pitch parameter or pitch value derived from the data stream, namely from portion 44 of data stream 14, i.e., the portion 44 preceding the lost portion 20 of data stream 14.

The second PLC tool PLC 2 may be dedicated for the recovery of audio signals of polyphonic type. The concealment of this second PLC tool PLC 2 may be based on tonal frequency domain packet loss concealment.

Figure 5:
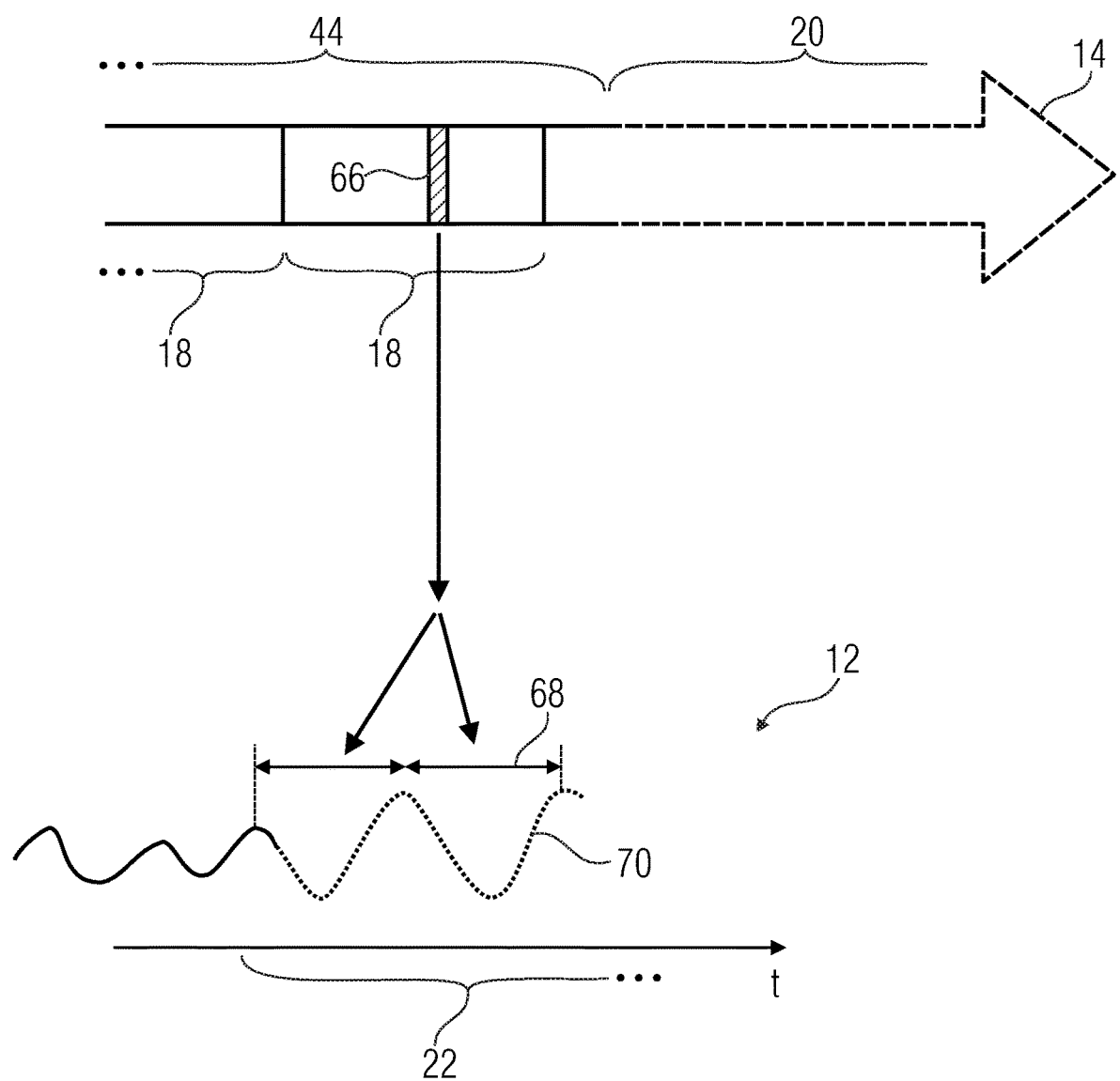
FIG. 5 illustrates a schematic diagram for illustrating the mode of operation of PLC 1 of FIG. 2.
Figure 6:
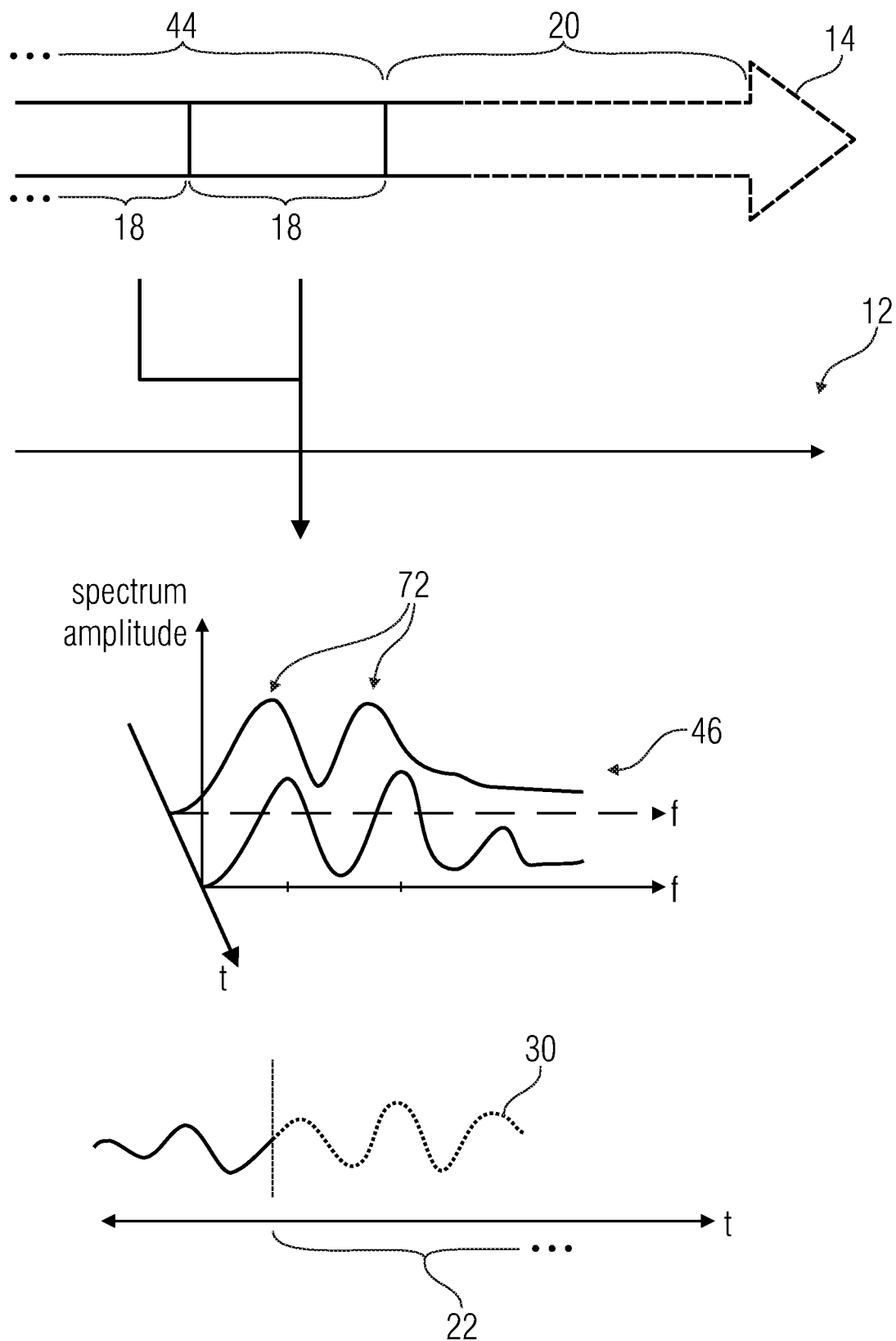
FIG. 6 shows a schematic diagram illustrating a mode of operation of PLC 2 in accordance with an embodiment.

With respect to FIGS. 5 and 6, a possible implementation of PLC 1 and PLC 2 will be briefly explained.

FIG. 5 illustrates PLC 1. A pitch parameter or pitch value 66 conveyed in a frame 18 within portion 44 preceding lost portion 20 of data stream 14 is used to set a periodicity or period length 68 of a periodic signal 70 which is then used to form a substitute or used to conceal the loss within portion 22 of audio signal 12. The pitch parameter or pitch value 66 may be present in data stream 14 in order to be used by audio decoder 10 in case of normal audio decoding, i.e., no signal loss, for controlling, for instance, a harmonic filter tool or the like. That is, parameter 66 may be present in data stream 14 anyway. Otherwise, PLC tool 28 performing PLC 1 according to FIG. 5 could determine the pitch period 68 by analysis such as by analyzing the decoded signal 51 in front of the lost portion 22 or by analyzing the most recent accessible version of the spectrum such as spectrum 46 depicted in FIG. 3.

FIG. 6 illustrates PLC 2 in accordance with an embodiment. Here, the PLC tool 28, responsible for performing PLC 2, uses, for instance, one or two or more most recently obtained spectra as obtained from portion 44 of data stream 14 so as to detect or determine tonal spectral components therein, i.e., peaks 72 in the spectrum 46 or peaks 72 in spectrum 46 occurring at that position or a sufficiently similar position in the spectrum of a certain number of consecutive spectra or frames 18, respectively. Sufficiently similar positions may be ones the spectral distance of which is below a certain threshold. The spectral positions of the peaks 72 represent the tonal spectral components and here, at these spectral locations, the phase detection is performed by use of, for instance, or by evaluation of, for instance, a power spectrum of the audio signal. Then, within the temporal portion 22 within which the signal loss is to be concealed, a combination of signals, periodicities of which depend on the tonal spectral components, is formed so as to yield the supplement signal 30, wherein a mutual phase shift between the combined signals is adjusted depending on the phase detection. For instance, a phase is determined for each tonal component 72 or merely phase differences between these tonal components are determined, and a signal is formed as the substitute 30 within portion 22 which is synthesized by these tonal components 72 with obeying the phase differences or phases. The combination may be formed in spectral domain with deriving the substitute signal 30 by inverse transformation, or in time-domain directly by adding, for instance, appropriately mutually shifted signals, the mutual shift reflecting the mutual phase shift determined.

As described in more detail below, the assignment 60 may be done in a manner so that PLC 1 is chosen or assigned to portion 22 the more likely the lower the spectral position 48 is and the higher the temporal predictability is and, vice versa, PLC 2 is assigned or selected the more likely the higher the spectral position 48 is and the lower the temporal predictability is. A higher spectral position corresponds to a higher frequency and a lower spectral position to a lower frequency. By doing this in this manner, PLC 1 is more likely chosen in case of portion 22 corresponding to lost speech and PLC 2 is more likely selected in case of portion 22 relating to polyphone signals or music.

Figure 7:
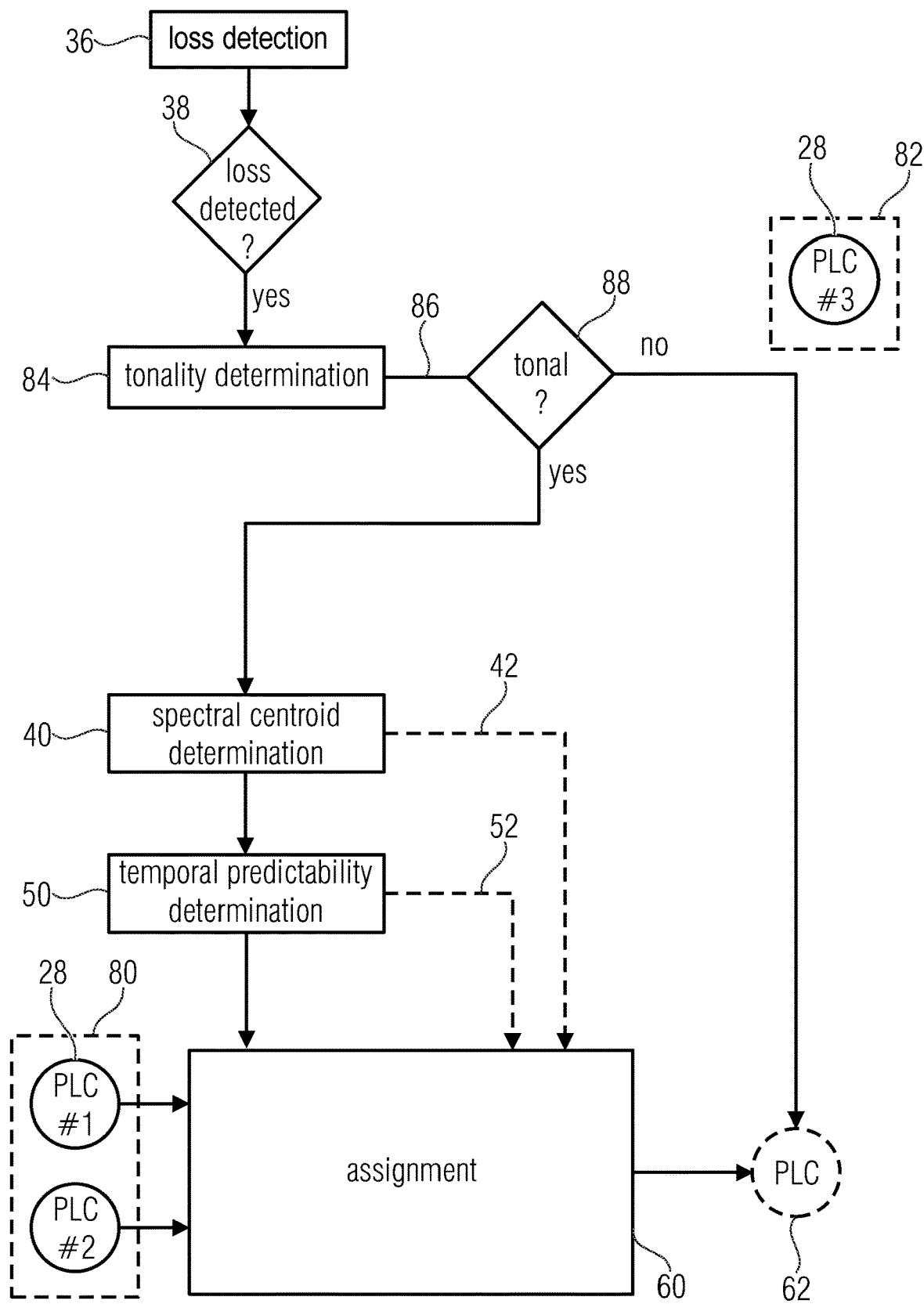
FIG. 7 shows a flow diagram of a modified version of the assignment operation of FIG. 2, extended so as to perform an assignment out of a set of PLC tools for packet loss concealment PLC 1 to PLC 3 in accordance with an embodiment.

For the sake of completeness, FIG. 7 shows the fact that the assignment process of FIG. 2 may be extended. In particular, as shown in FIG. 2, the assignment 60 has been done by restricting the assignment or selection of assignment 60 onto a subset 80 of PLC tools 28. The set 26 of PLC tools 28 may contain a further subset of one or more PLC tools 28, such as subset 82 and, when triggered by loss detection 36, a tonality detection 84 may be used by assigner 32 first in order to determine whether portion 22 relates to a tonal portion or not. The tonality determination 84 yields a tonality measure or indicator 86 and this tonality measure indicator 86 may be obtained in 84 by use of one or more parameters within portion 44 of data stream 14, for instance such as by inspecting whether or not a most recent frame 18 within portion 44 comprises a certain pitch parameter such as a pitch value 66 as described in FIG. 5. In case of absence, this may be interpreted as an indication that the audio signal is currently non-tonal and, in case of presence of the pitch parameter 66, this may be interpreted as indicating that the audio signal is currently tonal. This indication is then the tonality measure 86. Using measure 86 it is discriminated at 88 whether the audio signal is tonal or not and, if it is non-tonal, the PLC 62 assigned to portion 22 is assigned out of subset 82. FIG. 7 illustrates the case where one PLC tool 28 is comprised by subset 82 and this one is chosen. However, even here, a further selection out of subset 82 may follow. If tonality is confirmed at 88, the assignment 60 based on determinations 40 and 50 is performed with respect to subset 80 as described above with respect to FIG. 2.

PLC 3 may be a non-tonal PLC such as a PLC which recovers an audio signal for a portion 22 by use of frame repetition with or without replicate modification, when the replicate modification may, as indicated above, involve sign scrambling, i.e., a random sign flip of spectral coefficients of a most recently received spectrum such as spectrum 46 which is then inversely transformed and used to derive substitute signal 30.

Figure 8:
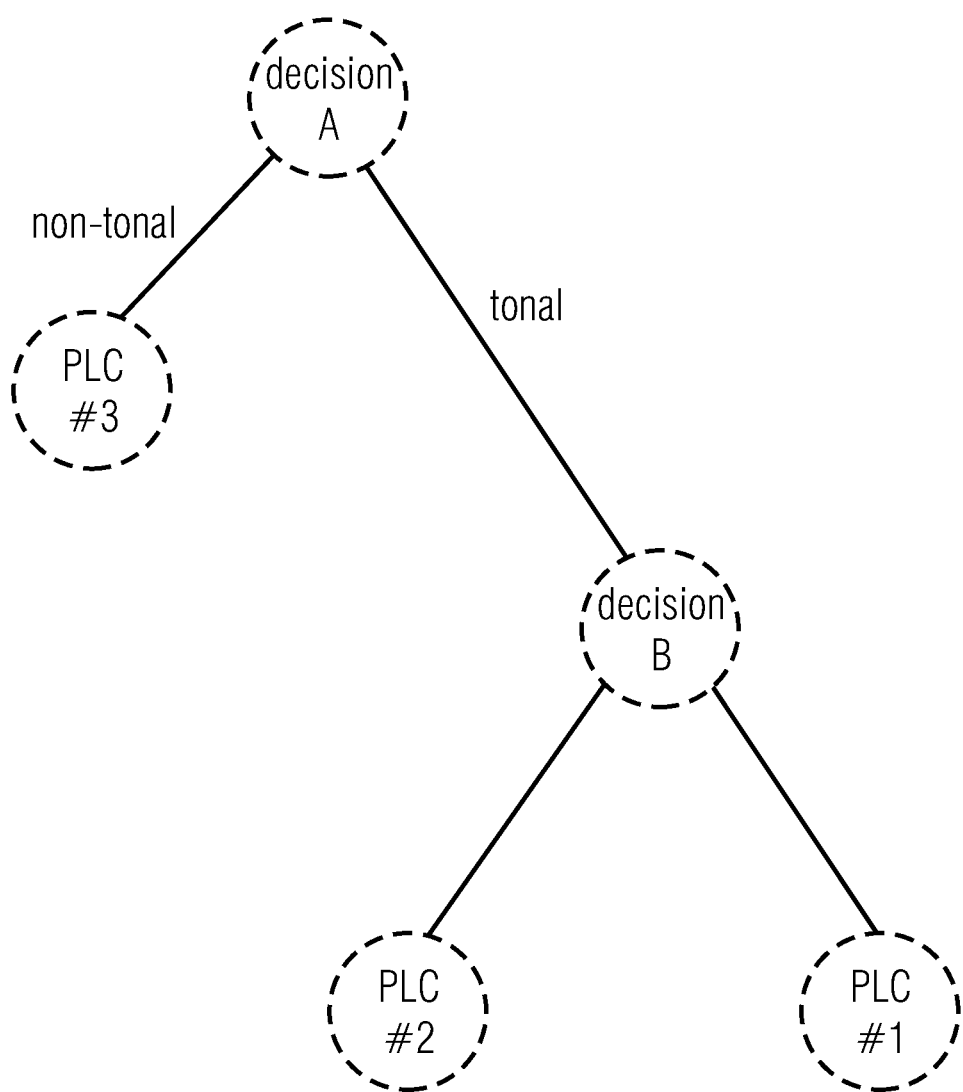
FIG. 8 shows a decision tree for deciding among three PLC tools to which decision tree the embodiment of FIG. 7 corresponds.

FIG. 8 visualizes a decision tree for selecting among the PLC tools 28 in accordance with a manner which corresponds, for instance, to FIG. 7. Decisions A and B are made to decide which of three PLC methods PLC 1 to PLC 3, which are designed for different signal types, are to be used for a certain missing signal portion 22 in order to get the best concealment performance. The first decision, decision A, is based on tonality. If the signal turns out to be non-tonal, PLC 3 is used for concealment. If tonal, decision B is made. Decision B checks the tonal signal characteristics based on measures 42 and 52 in the manner described above with respect to FIGS. 2 and 7 and, depending on the characteristics, chooses one of PLC 1 or PLC 2. As explained above, PLC 1 may be a tonal time domain PLC for monophone and/or speech signals, while PLC 2 may be a tonal frequency domain PLC for a polyphone and/or music signals.

The decision tree of FIG. 8, thus, visualizes decisions, which may be taken between three PLC methods for different signal types to get the best concealment performance. The decision A, which may correspond to check 88 of FIG. 7, may be done by inspecting a signal type classification, i.e. by using it as an indication of, or by deriving therefrom a tonality indicator. The signal type classification is possibly present in each frame 18 and indicates a frame class of each frame. It could be calculated on encoder side and transmitted in the bitstream 14 to the audio decoder. Even alternatively, it could be calculated on decoder side. However, the calculation of the frame class is very complex and may entail that all features are calculated in every frame due to a frame dependency of the frame class. Therefore, for low-complexity applications, it may be advantageous if a simpler approach is used. As indicated above, the presence or absence of some pitch parameter 66 may be used as indicator 86.

The decision B which corresponds to assignment 60 based on determinations 40 and 52, yields a good choice between PLC #1 and PLC #2. In [6], such a choice has been done based on a stability measurement of the spectral envelope, which correlates to the short-term stationarity of the signal. However, the more stationary a signal is, the better the performance both tonal PLC methods PLC #1 and PLC #2 is. This means stationarity is, hence, not a suitable criterion to select the optimal tonal concealment method. The stationarity feature indicates tonality very well, however it cannot differentiate between speech/monophonic and polyphonic/music.

As discussed above, it is possible, to perform the decision tree of FIG. 8 using a PLC classifier represented by assigner 32, which may operate on a frame-by-frame basis without any inter-frame dependencies and may thus involve merely a low complexity. It may calculate its classification features 42 and 52 only in case of a frame loss, as detected or checked at 38, and therefore does not add an immanent complexity offset in the error-free frames among frames 18.

The decision A may be done based on a tonality indicator 86, which can be the presence of a pitch value in the last good received audio frame. The decision B may be done by using the spectral centroid 48 and a long term prediction gain 56 calculated on the last good received audio frame.

The decision B may switch between a pitch-based time domain concealment method PLC #1, best suited for monophonically and speech-like signals, and frequency domain methods PLC #2, best suited for polyphone or complex music signals. An advantage of the classification of decision B results from the fact, that:
  the spectral centroid is spectrally located very low for speech signals and higher for music signals;
  the long term prediction gain is high for monophonic and stationary signals like speech signals and low for polyphonic or less stationary signals like tonal or complex music signals.

Therefore, a weighted combination of both features 42 and 52 may be used for decision B and assignment process 60 and results in a reliable discrimination of speech/monophonic and polyphonic/complex music signals. At the same time, the complexity may be kept low.

If the audio decoder receives a corrupted frame or if the frame is lost, i.e. encounters a lost portion 20, as detected at 38, the following may be done, wherein reference is also made to FIG. 2:
  a. Decision A is made, at 88, whether to use a tonal concealment method like PLC #2 or PLC #1 for concealing the lost/corrupted frame representing portion 20, or concealing the loss of the corresponding portion 22. This decision A is based on a tonality indicator 68 for which the presence of a pitch value 66 in the last good frame in the bitstream can be used.

b. For a negative decision A, no tonal PLC is used. Instead, another PLC method is used in that case, i.e. PLC #3. Same may use frame repetition with sign scrambling.
c. For a positive decision A, one of two tonal PLC methods PLC #1 and PLC #2 is used to conceal the lost/corrupted frame. The two PLC methods can be either the time domain pitch-based PLC such as TCX TD-PLC of [4] or frequency domain tonal concealment such as the tonal MDCT concealment in [4], wherein the corresponding description is incorporated herein by reference.

For a positive decision A, the features 42 and 52 may be calculated based on the last good frame in the following manner:

As feature or measure 52, a long term prediction gain xcorr:

$$xcorr = \frac{\sum_{k=0}^{N-1} x(k) \cdot x(k - T_c)}{\sqrt{\left(\sum_{k=0}^{N-1} x(k) \cdot x(k)\right) \cdot \left(\sum_{k=0}^{N-1} x(k-T_c) \cdot x(k-T_c)\right)}}$$

may be computed in 50, where $T_c$ is the pitch value of the last good frame and $x(k)$, $k=0 \ldots N-1$, are the last decoded time samples of the last good frame and $$N = \begin{cases} T_c, & T_c < N_F \\ N_F, & \text{else} \end{cases}$$

where $N_F$ can be a limited value like the maximum pitch value or a frame length (for example 10 ms).

As feature or measure 42, a spectral centroid sc:

$$sc = \frac{\sum_{k=0}^{N-1} |X_{s\_lastGood}(k)| \cdot \frac{k+1}{N}}{\sum_{k=0}^{N-1} |X_{s\_lastGood}(k)|}$$

may be computed in 40, where N is the length of the last received spectrum $X_{s\_lastGood}(k)$ and $|X_{s\_lastGood}(k)|$ means the magnitude spectrum.

The two calculated features are combined with the following formula:

class=$w_1 \cdot xcorr + w_2 \cdot sc + \beta$ where $w_1$, $w_2$ and $\beta$ are weights. In one embodiment, these are $w_1=520/1185$, $w_2=-1$ and $\beta=287/1185$. Alternatives are setting $w_1$, $w_2$ and $\beta$ so that $\frac{1}{4}<w_1<\frac{3}{4}$, $-2<w_2<-\frac{1}{2}$, and $-\frac{1}{2}<\beta<-\frac{1}{16}$. The weights may be normalized here to be in the range [−1:1]

Then, the PLC #1, e.g. time domain pitch-based PLC method, may be chosen if class >0 in 60 and PLC #2, such as a frequency domain tonal concealment, otherwise.

Some notes shall be made with respect to the above description. For instance, the spectrum, the spectral centroid of which is measured to obtain the first measure 42, might be a so called weighted version such as a pre-emphasized version. Such weighting is used, for instance, to adapt the quantization noise to the psychoacoustic masking threshold. In other words, it might be that the first measure 42 measuring a spectral position 48 of a spectral centroid of a psychoacoustic scaled spectrum of the audio signal. This might be especially advantageous in cases where the normal audio decoding coded underlying audio decoding core 24 involves that data stream 14 has audio signal 12 encoded thereinto in spectral domain anyway, namely in the weighted domain.

Additionally or alternatively, the spectrum, the spectral centroid of which is measured to obtain the first measure 42, is not necessarily one represented at a spectral resolution as high as the spectral resolution used in the audio decoding core 24 to transition to time domain. Rather, it may be higher or lower. Even additionally or alternatively, it should be noted that the audio signal's spectrum also manifests itself in scale factors. Such scale factors might be transmitted in the data stream 14 along with spectral coefficients in order to, together, form a coded representation of the audio signal's spectrum. For a certain portion 22, the spectral coefficients are scaled according to the scale factors. There are more spectral coefficients than scaler factors. Each scale factor, for instance, is assigned to one of several spectral bands, so called scale factor bands, into which the audio signal's bandwidth is partitioned. The scale factors, thus, define the spectrum of the audio signal for a certain portion in terms of envelope at some spectral resolution reduced compared to the one at which the quantized spectral coefficients are coded in the data stream 14. It could even be that the spectral resolution at which the scale factors are coded in the data stream 14 is even lower than a spectral resolution at which the decoding core 24 performs the dequantization of the spectral coefficients. For instance, the decoding core 24 might subject the scale factors coded into the data stream 14 to spectral interpolation to obtain interpolated scale factors of higher spectral resolution as the ones coded into the data stream, and use the interpolated scale factors for dequantization. Either one of the scale factors coded into the data stream and the interpolated scale factors might be used as the spectrum of the audio signal the spectral centroid of which is measured by the first measure 42. This means that centroid measurement becomes quite computational efficient to be determined as the number of computational operations to be performed to determine the first measure is low compared to performing the centroid measurement at any higher resolution such as at the one at which the spectral coefficient are coded or some other resolution in case of obtaining the spectrum for the centroid measurement by subjecting the decoded audio signal to an extra spectral decomposition which would even further increase the efforts. Thus, as a concrete example, first and second measures could be computed as follows based on coded downsampled scale factors SNS (spectral noise shaping):

Firstly, a pitch value $T_c$ might be computed as a basis:

$$T_c = \begin{cases} 0, & \text{pitch\_present} = 0 \\ \text{pitch\_int}, & \text{pitch\_present} = 1 \end{cases} \quad (1)$$

where pitch_present and pitch_int are bitstream parameters derived by the decoder from the last good frame. pitch_present can be interpreted as a tonality indicator.

As the second measure, a long term prediction gain xcorr might be computed according to:

$$xcorr = \frac{\sum_{k=0}^{N-1} x(k) \cdot x(k - T_c)}{\sqrt{\left(\sum_{k=0}^{N-1} x(k) \cdot x(k)\right) \cdot \left(\sum_{k=0}^{N-1} x(k - T_c) \cdot x(k - T_c)\right)}} \quad (2)$$

where x(k), k=0 . . . N−1 are the last decoded time samples and N can be can be a predetermined length value such as limited value like the maximum pitch value or a frame length $N_F$ (for example 10 ms), for example $$N = \begin{cases} 2 \cdot pitmin, & T_c < 2 \cdot pitmin \\ T_c, & 2 \cdot pitmin \leq T_c \leq N_F \\ N_F, & T_c > N_F \end{cases} \quad (3)$$

where pitmin is the minimal pitch value. Thus, the second measure would be computed as the self-similarity of the decoded audio time signal at the most recently received portion with itself, mutually shifted at the pitch.

As the second measure, a spectral centroid sc could be computed as:

$$sc = \frac{f_s}{48000} \cdot \frac{\sum_{k=0}^{15} g_d(k) \cdot \frac{bands(k)}{N_F}}{\sum_{k=0}^{15} g_d(k)(I_{fs}(4k+4) - I_{fs}(4k))} \quad (4)$$

where $f_s$ is the sampling rate and $$bands(k) = \sum_{b=I_{fs}(4k)+1}^{I_{fs}(4k+4)} b \text{ for } k = 0 \ldots 15 \quad (5)$$

and $I_{fs}$ are non-uniform band indices, i.e. band indices defining for each band the lower and upper frequency border in a manner so that the band widths defined by the difference between the associated lower and upper border differ from each other such as increase with increasing frequency although the difference is optional. The band indices might be defined in dependency of the sampling rate/frequency of the audio signal. Further, $$g_d(k) = \frac{2^{scfQ_{-1}(k)}}{10^{k\frac{g_{tilt}}{150}}} \text{ for } k = 0 \ldots 15 \quad (6)$$

where scf $Q_{-1}(k)$ is the scale factor vector stored in the bitstream of the last good frame and $g_{tilt}$ is a predetermined tilt factor which might be set by default and, possibly, depending on the sample frequency of the audio signal. The term $2^{scfQ_{-1}(k)}$ is applied to get the scalefactors coded in the logarithmic domain back in the linear domain. The term $$\frac{1}{10^{k\frac{g_{tilt}}{150}}}$$

is applied to inverse the encoder side pre-emphasis filter, which is called de-emphasis filter.

The scale factor vector is calculated at encoder side and transmitted in the bitstream. It is determined on the energies per band of the MDCT coefficients, where the bands are non-uniform and follow the perceptually-relevant bark scale (smaller in low-frequencies, larger in high-frequencies). After smoothing, pre-emphasing and transforming the energies to logarithmic domain, they are, at the encoder side, downsampled from 64 parameters to 16 parameters to form the scale factor vector, which afterwards is coded and transmitted in the bitstream. Thus, sc is a measure for a spectral position 48 of a spectral centroid of a spectrum 46 of the audio signal, here determined based on the spectrally coarse sampled version thereof, namely the SNS parameters.

The decision or selection among the various PLC methods may then be done with the criteria xcorr and sc. Frame repetition with sign scrambling might be selected if $T_c=0$ (which means that the tonality indicator pitch_present=0). Otherwise, the value class is calculated as follows:

$$class=7640/23768xcorr-sc-5112/32768 \quad (7)$$

time domain pitch-based PLC method might be chosen if class >0; frequency domain tonal concealment otherwise.

Thus, an audio decoder for decoding an audio signal 12 from a data stream 14, which comprises a set 26 of different loss concealment tools 28 might be configured to determine 40 a first measure 42 measuring a spectral position 48 of a spectral centroid of a spectrum 46 of the audio signal by deriving the spectrum from scale factors in a most recent non-lost portion of the data stream, determine 50 a second measure 52 measuring a temporal predictability of the audio signal, assign 32 one 62 of the set 26 of different loss concealment tools 28 to a portion 22 of the audio signal 12 affected by loss based on the first and second measures, and recover the portion 22 of the audio signal using the one loss concealment tool 62 assigned to the portion 22. The derivation of the spectrum might involve, as described, subjecting the scaler factors coded in the data stream to spectral interpolation. Additionally or alternatively, they may be subject to de-emphasis filtering, i.e. they might be multiplied by a de-emphasis filter's transfer function. The resulting scale factors may then be subject to spectral centroid measurement. All the other details described above may then be applied as well. That is, to mention examples which are not meant be exclusively: The set 26 of different loss concealment tools may comprise a first loss concealment tool for audio signal recovery of monophonic portions, and a second loss concealment tool for audio signal recovery of polyphonic portions, and the audio decoder may be configured to, in assigning the one of the set of different loss concealment tools to the portion of the audio signal based on the first and second measures, assign the first loss concealment tool to the portion the more likely the lower the spectral position of the spectral centroid is and the higher the temporal predictability is, and assign the second loss concealment tool to the portion the more likely the higher the spectral position of the spectral centroid is and the lower the temporal predictability is. Additionally or alternatively, the audio decoder may be configured to, in assigning one of the set of different loss concealment tools to a portion 22 of the audio signal affected by loss based on the first and second measures, perform a summation over the first and second measures 42, 52 so as to obtain a scalar sum value and subjecting the scalar sum value to thresholding.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] 3GPP TS 26.445; Codec for Enhanced Voice Services (EVS); Detailed algorithmic description.
[2] ITU-T G.718: Frame error robust narrow-band and wideband embedded variable bit-rate coding of speech and audio from 8-32 kbit/s.
[3] ITU-T G.711 Appendix I: A high quality low-complexity algorithm for packet loss concealment with G.711.
[4] 3GPP TS 26.447; Codec for Enhanced Voice Services (EVS); Error concealment of lost packets.
[5] Method and device for efficient frame erasure concealment in speech codecs; WO2007073604 (A1)—2007-07-05
[6] Selecting a Packet Loss Concealment Procedure; EP3111624 A1—2017-01-04

The invention claimed is:

1. An audio decoder for decoding an audio signal from a data stream, the audio decoder comprising a set of different loss concealment tools and configured to:
   determine a first measure measuring a spectral position of a spectral centroid of a spectrum of the audio signal;
   determine a second measure measuring a temporal predictability of the audio signal;
   assign one tool out of the set of different loss concealment tools to a portion of the audio signal affected by loss based on the first and second measures; and
   recover the portion of the audio signal using the one loss concealment tool assigned to the portion,
   wherein the set of different loss concealment tools comprises:
   a first loss concealment tool for audio signal recovery of monophonic portions; and a second loss concealment tool for audio signal recovery of polyphonic portions, and wherein the audio decoder is configured to, in assigning the one tool out of the set of different loss concealment tools to the portion of the audio signal based on the first and second measures, assign the first loss concealment tool to the portion the more likely the lower the spectral position of the spectral centroid is and the higher the temporal predictability is, and assign the second loss concealment tool to the portion the more likely the higher the spectral position of the spectral centroid is and the lower the temporal predictability is.

2. The audio decoder of claim 1, wherein the first loss concealment tool performs audio signal recovery by audio signal synthesis using a periodic signal of a periodicity which depends on a pitch value derived from the data stream, wherein the second loss concealment tool performs audio signal recovery by detecting tonal spectral components of the audio signal, performing phase detection at the tonal spectral components and audio signal synthesis by combining signals of periodicities which depend on the tonal spectral components with adjusting a mutual phase shift between the signals depending on the phase detection, and wherein the set of different loss concealment tools further comprises a third loss concealment tool performing audio signal recovery by use of frame repetition, with or without replicate modification.

3. The audio decoder of claim 1, wherein the first loss concealment tool performs audio signal recovery using tonal time domain packet loss concealment, and wherein the second loss concealment tool performs audio signal recovery using tonal frequency domain packet loss concealment.

4. The audio decoder of claim 1, wherein the first loss concealment tool performs audio signal recovery by audio signal synthesis using a periodic signal of a periodicity which depends on a pitch value derived from the data stream, and wherein the second loss concealment tool performs audio signal recovery by detecting tonal spectral components of the audio signal, performing phase detection at the tonal spectral components and audio signal synthesis by combining signals of periodicities which depend on the tonal spectral components with adjusting a mutual phase shift between the signals depending on the phase detection.

5. The audio decoder of claim 4, wherein the audio decoder is configured to derive the pitch value from the data stream by using a most recent pitch parameter conveyed in the data stream as the pitch value.

6. The audio decoder of claim 4, wherein the audio decoder is configured to perform the detection of the tonal spectral components by identifying co-located peaks in one or more consecutive spectra derived from a most recent non-lost portion of the data stream.

7. The audio decoder of claim 6, wherein the data stream comprises the most recent non-lost portion of the data stream encoded thereinto in spectral domain.

8. The audio decoder of claim 1, configured to:

perform loss detection to detect portions affected by loss, perform the determination of the first and second measures for the portion responsive to the loss detection detecting the portion affected by loss, and refrain from performing the determination for portions not affected by loss.

9. The audio decoder of claim 1, further configured to:

determine a tonality indicator indicative of a tonality of the audio signal, assign one of first and second subsets of one or more loss concealment tools out of the set of different loss concealment tools, which are mutually disjoint, to the portion of the audio signal based on the tonality indicator, and perform the assignment of the one tool out of the set of different loss concealment tools to the portion of the audio signal based on the first and second measures by assigning the one tool out of the set of different loss concealment tools to the portion of the audio signal based on the first and second measures out of the first subset of one or more loss concealment tools if the first subset is assigned to the portion with performing the recovery of the portion of the audio signal using the one loss concealment tool assigned to the portion, and perform the recovery of the portion of the audio signal using one out of the second subset of the loss concealment tools if the second subset of the loss concealment tools is assigned to the portion.

10. The audio decoder of claim 9, wherein the audio decoder is configured to use a parameter conveyed in the data stream as the tonality indicator.

11. The audio decoder of claim 9, wherein the audio decoder is configured to use a presence or non-presence of a pitch parameter in a most recent non-lost frame of the data stream as the tonality indicator.

12. The audio decoder of claim 9, wherein the first loss concealment tool performs audio signal recovery by audio signal synthesis using a periodic signal of a periodicity which depends on a pitch value derived from the data stream, wherein the second loss concealment tool performs audio signal recovery by detecting tonal spectral components of the audio signal, performing phase detection at the tonal spectral components and audio signal synthesis by combining the signals of periodicities which depend on the tonal spectral components with adjusting a mutual phase shift between the signals depending on the phase detection, wherein the set of different loss concealment tools further comprises a third loss concealment tool performing audio signal recovery by use of frame repetition, with or without replicate modification, and wherein the third loss concealment tool is comprised by the second subset and the first and second loss concealment tools are comprised by the first subset.

13. The audio decoder of claim 1, configured to determine the first measure by a weighted sum of spectral component location values, each weighted using the spectrum of the audio signal at the respective spectral component location value.

14. The audio decoder of claim 1, configured to determine the second measure by a correlation measure measuring a self-similarity of the audio signal.

15. The audio decoder of claim 1, configured to determine the second measure by deriving a pitch from the audio signal and determining the second measure as a correlation measure measuring an autocorrelation of the audio signal at a temporal shift which depends on the pitch.

16. The audio decoder of claim 1, configured to, in assigning the one tool out of the set of different loss concealment tools to the portion of the audio signal affected by loss based on the first and second measures, perform a summation over the first and second measures so as to acquire a scalar sum value and subjecting the scalar sum value to thresholding.

17. The audio decoder of claim 1, configured to determine the first measure by deriving the spectrum from scale factors in a most recent non-lost portion of the data stream.

18. The audio decoder of claim 1, configured to determine the first measure by deriving the spectrum from scale factors in a most recent non-lost portion of the data stream and subjecting the scale factors coded in the data stream to spectral interpolation.

19. The audio decoder of claim 17, configured to subject the scale factors to a de-emphasis filtering by multiplication with a de-emphasis filter's transfer function.

20. A method for performing loss concealment in audio decoding an audio signal from a data stream, the method comprising:
- determining a first measure measuring a spectral position of a spectral centroid of a spectrum of the audio signal;
- determining a second measure measuring a temporal predictability of the audio signal;
- assigning one tool out of a set of different loss concealment tools to a portion of the audio signal affected by loss based on the first and second measures; and
- recovering the portion of the audio signal using the one loss concealment tool assigned to the portion,
- wherein the set of different loss concealment tools comprises:
- a first loss concealment tool for audio signal recovery of monophonic portions; and
- a second loss concealment tool for audio signal recovery of polyphonic portions, and
- wherein the assigning the one tool out of the set of different loss concealment tools to the portion of the audio signal based on the first and second measures comprises assigning the first loss concealment tool to the portion the more likely the lower the spectral position of the spectral centroid is and the higher the temporal predictability is, and assigning the second loss concealment tool to the portion the more likely the higher the spectral position of the spectral centroid is and the lower the temporal predictability is.

21. A non-transitory digital storage medium having a computer program stored thereon to perform a method for performing loss concealment in audio decoding an audio signal from a data stream when said computer program is run by a computer, the method comprising:
- determining a first measure measuring a spectral position of a spectral centroid of a spectrum of the audio signal;
- determining a second measure measuring a temporal predictability of the audio signal;
- assigning one tool out of a set of different loss concealment tools to a portion of the audio signal affected by loss based on the first and second measures; and
- recovering the portion of the audio signal using the one loss concealment tool assigned to the portion,
- wherein the set of different loss concealment tools comprises:
- a first loss concealment tool for audio signal recovery of monophonic portions; and
- a second loss concealment tool for audio signal recovery of polyphonic portions, and
- wherein the assigning the one tool out of the set of different loss concealment tools to the portion of the audio signal based on the first and second measures comprises assigning the first loss concealment tool to the portion the more likely the lower the spectral position of the spectral centroid is and the higher the temporal predictability is, and assigning the second loss concealment tool to the portion the more likely the higher the spectral position of the spectral centroid is and the lower the temporal predictability is.

* * * * *